United States Patent
Verspecht et al.

(10) Patent No.: US 11,137,445 B1
(45) Date of Patent: Oct. 5, 2021

(54) METHOD AND APPARATUS FOR REDUCING NON-LINEAR DISTORTION

(71) Applicant: Keysight Technologies, Inc., Santa Rosa, CA (US)

(72) Inventors: Jan Verspecht, Londerzeel (BE); Augustine Stav, Rohnert Park, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 175 days.

(21) Appl. No.: 16/456,305

(22) Filed: Jun. 28, 2019

(51) Int. Cl.
*G01R 31/317* (2006.01)
*G01R 1/067* (2006.01)
*H03L 7/183* (2006.01)

(52) U.S. Cl.
CPC ... *G01R 31/31726* (2013.01); *G01R 1/06772* (2013.01); *G01R 31/31723* (2013.01); *H03L 7/183* (2013.01)

(58) Field of Classification Search
CPC .......... G01R 31/31726; G01R 1/06772; G01R 31/31723; H03L 7/183
USPC .................... 324/762.01, 537, 500
See application file for complete search history.

(56) References Cited

U.S. PATENT DOCUMENTS

| | | | |
|---|---|---|---|
| 9,793,857 B1 * | 10/2017 | Anderson | H03L 7/00 |
| 9,991,915 B2 | 6/2018 | Weiss | |
| 10,697,855 B2 * | 6/2020 | Roepke | F16H 57/01 |
| 2003/0102907 A1 * | 6/2003 | Tasker | G01R 27/28 |
| | | | 330/2 |
| 2004/0257092 A1 * | 12/2004 | Verspecht | G01R 27/28 |
| | | | 324/638 |
| 2005/0102124 A1 * | 5/2005 | Root | G06F 30/367 |
| | | | 703/14 |
| 2006/0176967 A1 * | 8/2006 | Stanton | G01R 23/20 |
| | | | 375/260 |
| 2016/0028498 A1 * | 1/2016 | Verspecht | H04B 17/29 |
| | | | 455/226.1 |
| 2017/0010345 A1 * | 1/2017 | Mitchell | G01S 7/2921 |

FOREIGN PATENT DOCUMENTS

EP 2822242 B1 4/2019

OTHER PUBLICATIONS

Keysight Technologies, Inc., N7621B Signal Studio for Multitone Distortion, Technical Overview, dated Aug. 4, 2014, pp. 1-12, USA.
Keysight Technologies, Inc., The Multitone Distortion Signal Creation documentation.
Keysight Technologies, Inc., Spectrum Analyzer Documentation.

\* cited by examiner

*Primary Examiner* — Giovanni Astacio-Oquendo

(57) ABSTRACT

A system and method for operating a data processing system to modify a time domain input signal to a signal generator to correct for distortions introduced by the signal generator are disclosed. The method includes receiving a target signal specifying a signal to be generated by the signal generator and initializing an input signal with the target signal, the method includes
a) inputting the input signal to the signal generator to arrive at a signal generator output signal;
b) measuring a frequency spectrum of the signal generator output signal with a test instrument;
c) updating the input signal based on a comparison of said measured frequency spectrum and a frequency spectrum of target input signal; and
d) repeating steps a)-c) until an exit condition is satisfied.

18 Claims, 3 Drawing Sheets

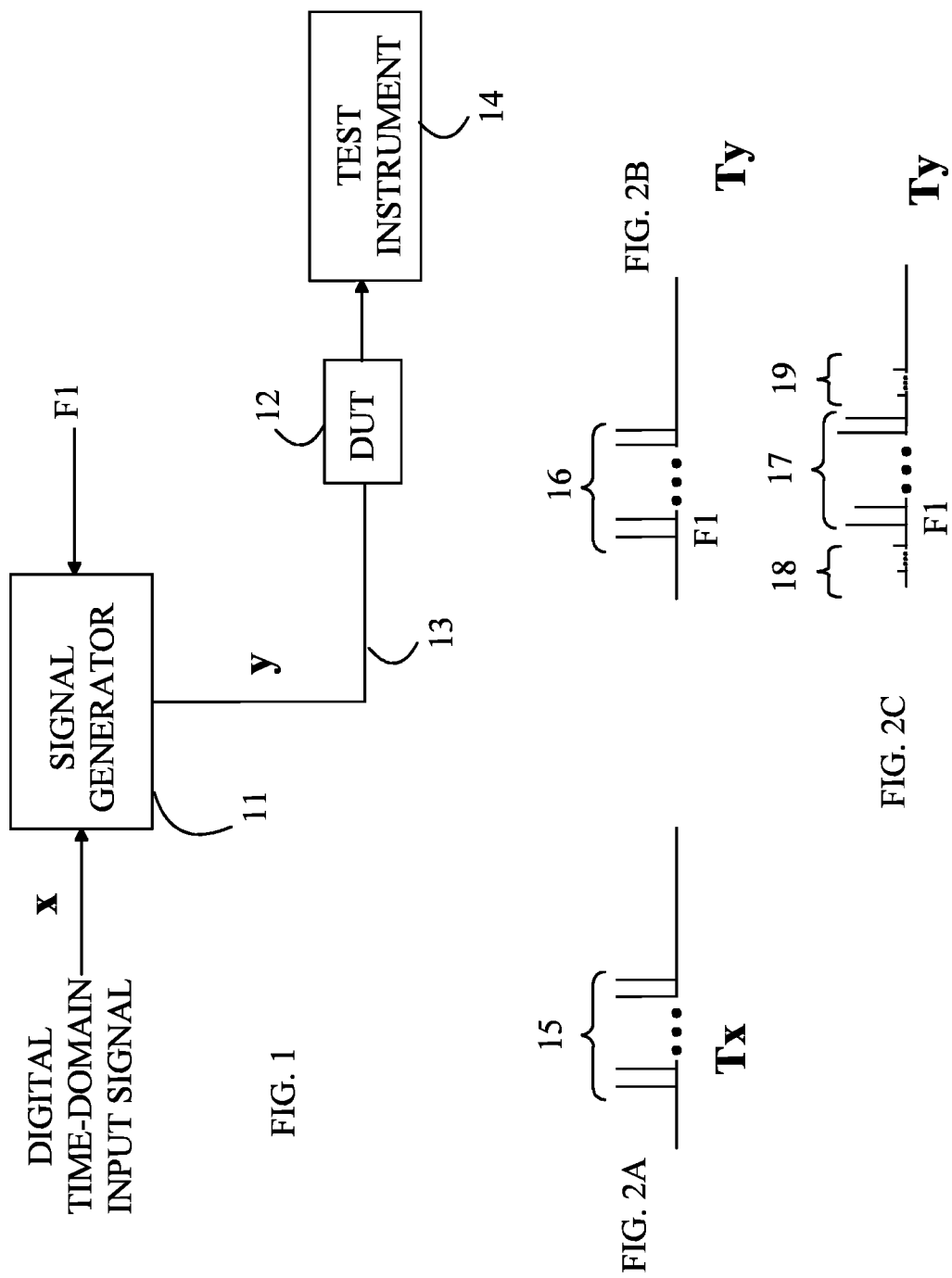

METHOD AND APPARATUS FOR REDUCING NON-LINEAR DISTORTION

BACKGROUND

When testing a high frequency device, a desired digital signal is input to a signal generator which converts that signal to an up-converted analog test signal that is applied to the device under test (DUT). The input digital signal is a repetitive time series having real and imaginary parts. The output of the signal generator ideally matches the digital signal upcoverted to the desired carrier frequency. Unfortunately, the signal generator can introduce non-linear distortions into the analog test signal. Correcting for these non-linear distortions presents significant challenges.

SUMMARY

The present invention includes a system and method for operating a data processing system to modify a time domain input signal to a signal generator to correct for distortions introduced by the signal generator. The method includes receiving a target signal specifying a signal to be generated by the signal generator and initializing an input signal with the target signal. The method includes a) inputting the input signal to the signal generator to arrive at a signal generator output signal;

b) measuring a frequency spectrum of the signal generator output signal with a test instrument;

c) updating the input signal based on a comparison of the measured frequency spectrum and a frequency spectrum of the target input signal; and d) repeating steps a)-c) until an exit condition is satisfied.

In one aspect, the frequency spectrum of the signal generator output signal is divided into one or more in band regions and one or more out-of-band regions, and wherein updating the input signal for frequencies in one of the out-of-band regions includes a different computational scheme than updating the input signal for frequencies in one of the in band regions.

In another aspect, the computational scheme for updating the input signal for frequencies in the one of the out-of-band regions includes measuring the frequency spectrum in the one of the out-of-band regions at an out-of-band tone in response to a plurality of probe signals, each probe signal includes the input signal combined with a corresponding probe tone having a known amplitude and phase, the corresponding probe tone is mapped by the signal generator to the out-of-band tone, the phase of each of the plurality of probe tones is different.

In another aspect, the plurality of probe signals includes three probe signals having different phases from one another.

In another aspect, the computational scheme for updating the input signal includes measuring a gain of the signal generator for one of the tones in the out-of-band region by inputting a test signal having a known amplitude and phase in a corresponding tone in the input signal.

In another aspect, the computational scheme for updating the input signal for frequencies in the one of the in band regions includes determining an aligned output signal from the input signal and tones in the output of the signal generator output signal.

In another aspect, updating the input signal for frequencies in the one of the in band regions includes determining a difference between each tone of the aligned output signal and corresponding tones in the target signal.

In another aspect, the test instrument is a vector network analyzer (VNA), the in band regions are analyzed separately from the out-of-band regions by the vector analyzer.

In another aspect, the VNA is characterized by a maximum bandwidth that can be analyzed for any given local oscillator (LO) frequency, the in band regions and the out-of-band regions are broken into chunks requiring less than the maximum bandwidth, each chunk utilizing a different LO frequency.

A system according to the present invention includes a signal generator having an input adapted to receive an input signal and an output adapted to transmit a time domain output signal based on the input signal to a DUT, the input signal is a repetitive time domain signal, a receiver adapted to measure a frequency spectrum of the time domain output signal while the time domain output signal is connected to the DUT, and a controller that is adapted to alter the input signal while the output signal is connected to the DUT.

The controller a) inputs the input signal to the signal generator to arrive at a signal generator output signal;

b) measures a frequency spectrum of the signal generator output signal with a test instrument;

c) updates the input signal based on a comparison of the measured frequency spectrum and a frequency spectrum of a target input signal; and d) repeats steps a)-c) until an exit condition is satisfied.

In another aspect, the frequency spectrum of the signal generator output signal is divided into one or more in band regions and one or more out-of-band regions, and wherein updating the input signal for frequencies in one of the out-of-band regions includes a different computational scheme than updating the input signal for frequencies in one of the in band regions.

In another aspect, the computational scheme for updating the input signal for frequencies in the one of the out-of-band regions includes measuring the frequency spectrum in the one of the out-of-band regions at an out-of-band tone in response to a plurality of probe signals, each probe signal includes the input signal combined with a corresponding probe tone having a known amplitude and phase, the corresponding probe tone is mapped by the signal generator to the out-of-band tone, the phase of each of the plurality of probe tones is different.

In another aspect, the computational scheme for updating the input signal for frequencies in the one of the in band regions includes determining an aligned output signal from the input signal and tones in the output of the signal generator output signal.

In another aspect, updating the input signal for frequencies in the one of the in band regions includes determining a difference between each tone of the aligned output signal and corresponding tones in the target signal.

In another aspect, the test instrument is a VNA, the in band regions are analyzed separately from the out-of-band regions by the vector analyzer.

The invention also includes a computer readable medium that includes instructions that cause a data processing system to execute a method for operating that data processing system to modify a time domain input signal to a signal generator to correct for distortions introduced by the signal generator. The method includes receiving a target signal specifying a signal to be generated by the signal generator and initializing an input signal with the target signal. The method also includes a) inputting the input signal to the signal generator to arrive at a signal generator output signal;

b) measuring a frequency spectrum of the signal generator output signal with a test instrument;

c) updating the input signal based on a comparison of the measured frequency spectrum and a frequency spectrum of the target input signal; and d) repeating steps a)-c) until an exit condition is satisfied.

In another aspect, the frequency spectrum of the signal generator output signal is divided into one or more in band regions and one or more out-of-band regions, and wherein updating the input signal for frequencies in one of the out-of-band regions includes a different computational scheme than updating the input signal for frequencies in one of the in band regions.

In another aspect, the computational scheme for updating the input signal for frequencies in the one of the out-of-band regions includes measuring the frequency spectrum in the one of the out-of-band regions at an out-of-band tone in response to a plurality of probe signals, each probe signal includes the input signal combined with a corresponding probe tone having a known amplitude and phase, the corresponding probe tone is mapped by the signal generator to the out-of-band tone, the phase of each of the plurality of probe tones is different.

In another aspect, the computational scheme for updating the input signal for frequencies in the one of the in band regions includes determining an aligned output signal from the input signal and tones in the output of the signal generator output signal.

In another aspect, updating the input signal for frequencies in the one of the in band regions includes determining a difference between each tone of the aligned output signal and corresponding tones in the target signal

BRIEF DESCRIPTION OF THE DRAWINGS

FIG. 1 illustrates a test setup in which an arbitrary signal generator 11 is used to generate an up-converted signal on line 13 that is applied to a DUT 12 whose output is examined by a test instrument 14.

FIG. 2A illustrates the frequency spectrum associated with the input signal to signal generator 11.

FIG. 2B illustrates the ideal frequency spectrum for the output from signal generator 11.

FIG. 2C illustrates the frequency spectrum of the actual output signal from signal generator 11.

DETAILED DESCRIPTION

Figure 3:
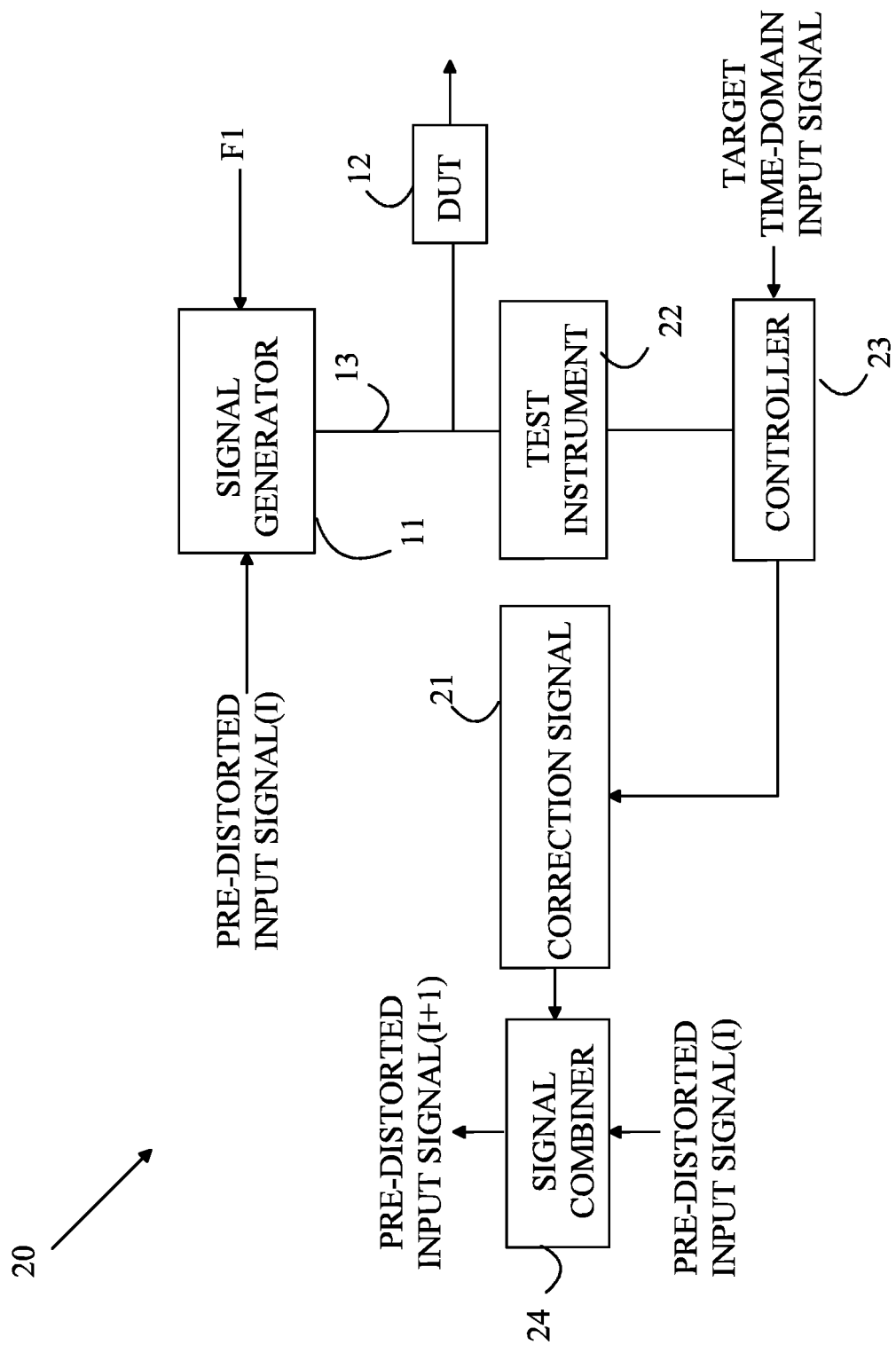
FIG. 3 illustrates a system for determining the predistortion tones for the distortions introduced by signal generator 11.

The manner in which the present invention provides its advantages can be more easily understood with reference to FIG. 1, which illustrates a test setup in which an arbitrary signal generator 11 is used to generate an up-converted signal on line 13 that is applied to a DUT 12 whose output is examined by a test instrument 14. The test setup shown in FIG. 1 allows the user to test the performance of DUT 12 when stimulated by an up-converted RF signal specified by up-converting the input signal to signal generator 11 to frequency F1. It is assumed that the input to signal generator 11 is a periodic baseband signal and that the output of signal generator 11 is also a periodic signal. Hence, frequency spectra of the input signal and output signal for signal generator 11 can be represented by a discrete list of complex frequency components, referred to as phasors, that are separated by the same constant frequency difference.

Refer now to FIGS. 2A-2C. FIG. 2A illustrates the frequency spectrum associated with the input signal to signal generator 11, FIG. 2B illustrates the ideal frequency spectrum for the output from signal generator 11, and FIG. 2C illustrates the frequency spectrum of the actual output signal from signal generator 11.

Consider an ideal repetitive time domain signal, x, to be up-converted to a frequency F by a signal generator to a time domain signal, y. Since the signals are periodic, each has a frequency spectrum consisting of a set of tones having a constant frequency separation between the tones. Denote the tones of x by $Tx_i$ and the tones of y by $Ty_i$. The $Tx_i$ are shown at 15 in FIG. 2A. Ideally, there will be one tone $Ty_i$ corresponding to each tone $Tx_i$ and the amplitude of the corresponding tone will be a constant gain times the amplitude of the $Tx_i$ tone and the phase of the corresponding $Ty_i$ will be a linear function of i plus a constant offset. The constant gain and offset, being the same for all i. This ideal set of tones are shown in FIG. 2B at 16. The band of ideal tones into which the ideal tones, Tx, are up-converted will be referred to as the in band tones in the present disclosure.

In practice, the signal generator is not ideal and introduces distortions into y as shown in FIG. 2C. These distortions alter the amplitude and phases of the Ty tones in the in band region 17, as well as introducing new tones above and/or below the in band region. The Ty in the in band region will be referred to as the in band tones, and Ty in regions 18 and 19 will be referred to as the out-of-band tones.

The present invention replaces x with a "pre-distorted" signal, x', that is transformed by the imperfect signal generator to a y that is closer to the ideal y discussed above. In general, x' will have tones at frequencies corresponding to the out-of-band regions of y that will cancel the out-of-band tones introduced by the signal generator. The tones of x' in the region corresponding to the in band regions of y will also be altered such that the distortions introduced by the signal generator will alter these tones to more closely match the ideal signal.

The pre-distorted signal is constructed in an iterative process. At each iteration, the previous approximation is input to the signal generator and the tones of the resultant y measured and compared to the tones of the ideal signal. For each measured tone, a pre-distortion tone is calculated from the difference between the measured tone and the corresponding ideal tone. The pre-distortion tone has the same amplitude as the difference tone but a phase that is 180 degrees different from that of the difference tone. A new approximation to x' is then generated by combining the tones of the previous approximation with calculated pre-distortion tones and then generating a new time domain signal. The procedure is iterated until an exit condition is satisfied. For example, the procedure can be terminated when a specific number of iterations are completed. In another example, the procedure is terminated when the power in the difference tones is less than some predetermined threshold.

Refer now to FIG. 3, which illustrates a system for determining the predistortion tones for the distortions introduced by signal generator 11. As noted above, the method of the present invention is an iterative method. The predistortion signal for the first iteration is set equal to the target time domain signal, i.e., the ideal signal discussed above. At each iteration, the time domain predistortion input signal generated in the previous iteration is input to signal generator 11. The time domain output of signal generator 11 is analyzed in test instrument 22 to arrive at a frequency spectrum for that output signal. Controller 23 compares this new frequency spectrum with the frequency spectrum of the target time domain signal. Controller 23 then generates a correction signal that is combined with the predistortion signal of the current iteration to generate a new predistortion time domain signal that should be closer than the predistortion signal of the current iteration in terms of producing an output signal from signal generator 11 that more closely matches the frequency spectrum of the target time-domain signal.

While the input and output signals associated with signal generator 11 are time domain signals, the calculation of the correction signal must start from an analysis of the tones in the frequency spectra corresponding to these time-domain signals. The output of signal generator 11 is input to a test instrument 22 that measures the output and determines the amplitude and phase of each of the frequency components in the signal. Controller 23 then compares each of these frequency components to the desired frequency components in the target time-domain signal to determine the magnitude and phase of the distortion introduced by signal generator 11 to each of the frequency components.

It should be noted that there may be other components between the output of signal generator 11 and DUT 12, such as amplifiers and transmission lines. To simplify the drawing, these components have been omitted from the drawing; however, for the purposes of the present disclosure, these components will be deemed to be included in signal generator 11.

Once controller 23 has generated the correct predistortion signal, that signal can be applied to DUT 12, and the output of DUT 12 analyzed. The correction provided by system 20 also corrects for any distortions that result from the connection of DUT 12 to signal generator 11. In one aspect of the invention, system 20 includes all of the components shown in FIG. 3, except DUT 12. Alternatively, test instrument 22 can be separate from system 20. In another aspect of the invention, test instrument 22 is also the instrument used to analyze the output of DUT 12. It will also be appreciated from the present disclosure that signal combiner 24 and correctional signal generator 21 can be implemented in software run on controller 23. Similarly, controller 23 can be implemented as part of the controller function in test instrument 22.

Figure 4:
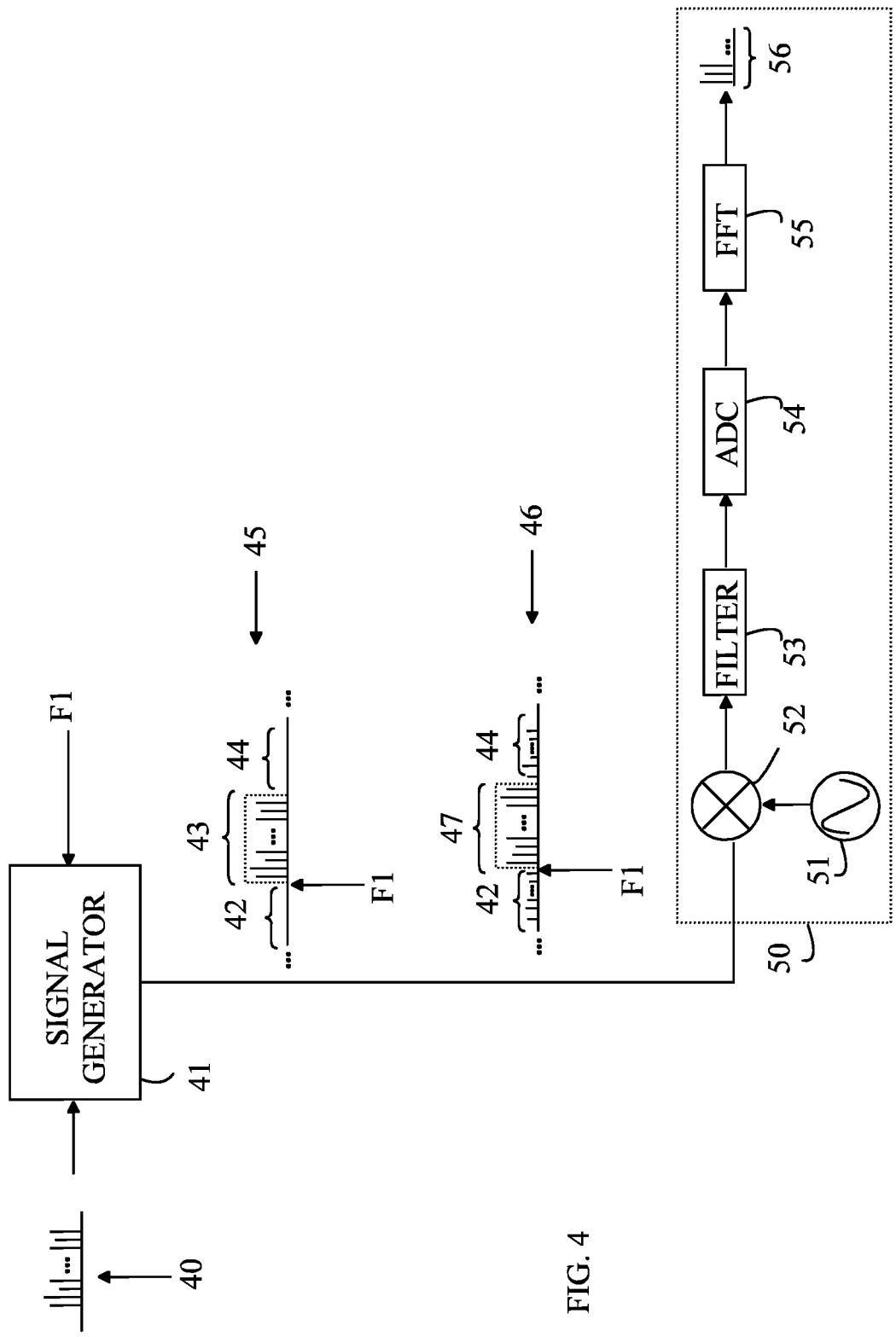
FIG. 4 illustrates the frequency spectra of the input and output signals of the signal generator.

Refer now to FIG. 4, which illustrates the frequency spectra of the input and output signals of the signal generator. Since the input signal is periodic, the spectrum of the input signal shown at 40 consists of a number of discrete equally spaced tones having an inter-tone frequency specified by the period of the repetitive input signal. Ideally, the output signal is a corresponding set of tones having the same spacing but up-converted to F1 as shown at 45. The output spectrum of the ideal signal only has power in band region 43 with no power in the adjacent bands shown at 42 and 44.

When the signal generator has a non-linear distortion, the output spectrum can differ from that shown at 45 in that there is now power in the out-of-band tones as shown at 42 and 44. In addition, the in band region 47 now differs from the ideal in band region 43. In addition, signal generator 41 typically supplies a constant power output. Hence, the gain at each frequency will depend on the amplitudes of the tones at other frequencies.

To arrive at a correction tone to be added to the input signal for the next iteration, the system must first measure the distortion to be corrected, i.e., compute an amplitude and phase that was "added" to the ideal amplitude and phase to arrive at the tone that was outputted by the signal generator. Test instrument 22 shown in FIG. 3 is typically a VNA, such as VNA 50. VNAs are known in the art, and hence, will not be discussed in detail here. For the purposes of the present application, VNA 50 includes a mixer 52 that down-converts the input signal to a frequency band determined by LO 51 and filter 53. The output of mixer 52 is typically low-pass filtered to eliminate unwanted mixing products and then digitized using an analog-to-digital converter (ADC) 54. The output of the ADC is then transformed using a fast Fourier transform (FFT) 55 to generate a spectrum 56 having a plurality of tones. VNA 50 typically includes a controller that performs various standardized measurements and controls LO 51 and other functions of the ADC and FFT.

It should be noted that the maximum bandwidth of spectrum 56 is typically much less than the bandwidth needed to measure all of the tones of interest in the output spectrum from signal generator 41. To overcome this limitation, the output spectrum from signal generator 41 is typically divided into a number of "chunks" of a size that can be measured by VNA 50. The beginning and ending tones of the measured chunks is determined by the frequency of LO 51 and the band pass of filter 53. The number of tones and the spacing of those tones in spectrum 56 is determined by the number of samples from ADC 54 that are subjected to the FFT.

In one aspect of the invention, the starting tone and spacing of the tones in spectrum 56 is set such that each tone in spectrum 56 corresponds to a tone in the output spectrum of signal generator 41. Hence an amplitude for each tone in the output spectrum of signal generator 41 can be measured together with a phase by choosing the appropriate chunk and the appropriate tone within the chunk that corresponds to that output spectrum tone.

For the purposes of the present disclosure, a chunk will be defined to be a set of adjacent tones having the same inter-tone spacing as the output tones of signal generator 41. As will be explained in more detail below, chunks do not overlap the in band and out-of-band regions of spectrum 46. That is, all of the tones in a chunk are either in band or out-of-band tones. Finally, each chunk has the same inter-tone frequency spacing and that spacing is the same as the inter-tone spacing in the ideal signal.

Given the magnitude and phase of the distortion in a tone, a predistortion tone having a phase 180 degrees different from the observed phase can be added to the input signal to the signal generator to provide a tone that cancels, or at least, reduces the amplitude of the distortion. However, to provide such a predistortion tone, the gain G provided by the signal generator to the predistortion tone must also be known, since the amplitude of the predistortion tone will be increased by this gain in arriving at the output of the signal generator. In addition, signal generator 41 may introduce a fixed phase offset that must be taken into account in determining the correct phase of the predistortion tone. That is, if the measured distortion in the $i^{th}$ tone in the spectrum measured by the VNA is $D_i$, a predistortion tone $D_i/G_i$ is to be subtracted from the tone in the input signal to signal generator. For the purposes of this disclosure, a tone that is characterized by an amplitude D and a phase will be denoted in bold type. Here, it should be noted that signal generator may introduce a fixed phase shift to the tone in question, and hence, the gain is shown as a vector quantity. The "subtraction" can be performed by adding a predistortion tone in which the phase of $D_i$ is rotated by 180 degrees.

Measuring the signal generator gain for each tone is complicated by the fact that most signal generators provide an overall gain that is fixed. Hence, when tones are added to the input, the gain available for other bands is reduced. In addition, the gain may vary with frequency and the amplitude of input tone.

One method for measuring the gain is to use a separate gain test signal having a frequency span and tone spacing equal to the output of signal generator 41. For example, a gain test signal having tone spacing the same as that of the ideal signal and a span sufficient to cover the out-of-band tones created by the non-linear distortion of the ideal signal in 42 and 44 can be utilized. In this gain test signal, each of the tones has the same amplitude, and the phase varies according to a known parabolic function of frequency. The output from the signal generator is then broken into chunks, and the tones in each chunk are measured by setting the appropriate LO frequency. In one exemplary gain test signal, the amplitude of each tone is set to the same constant value. The constant value is set to be a fraction of the average of the amplitudes in the tones of the ideal signal. For example, the test tone amplitudes could be set to one-half the average amplitude of the tones in the ideal signal.

While the measured gains of the gain test signal are useful in determining the relative gain of the signal generator as a function of tone frequency, the actual gains can be substantially different when the actual ideal signal plus cancellation tones are used as input, since the gain at a particular tone also depends on the amplitude of the other tones. In one exemplary embodiment, the gains in the out-of-band regions obtained with the test signal are adjusted to reflect the differences in average gain observed in the in band regions during each iteration. For example, the gains measured with the test signal are divided by the root-mean-square (RMS) gain in the in band region as initially measured with the test signal. At each iteration, the gains in the out-of-band region are then multiplied by the current value of the RMS gain in the in band region as observed in the current iteration.

The manner in which the present invention provides its advantages can be seen more easily with reference to an in band chunk. Denote the tones in the input signal by $Tx_i$. Denote the phase and amplitudes of the output from signal generator 41 for this chunk by $Y_i$. In the absence of distortion, there is some unknown delay introduced by signal generator 41 between the input and output of signal generator 41. Absent distortion, the phases of the tones in the chunk will be a linear function of the frequency of the tones and an overall constant phase offset. In one aspect, the first task is to find this delay by determining the delay that provides the maximum alignment between the $Tx_i$ and the $Y_i$. Define $Y'_i$ by $$Y'_i = Y_i e^{2\pi\delta fi}$$

Here, f is the separation frequency between the tones, and $\delta$ is chosen such that the Y'i are aligned with $Tx_i$. That is, $\delta$ is chosen to maximize the absolute value of the quantity:

$$C = \Sigma_{i=0}^{N-1} Y_i T x_i^*$$

Here N is the number of tones in the chunk being processed. It should be noted that the quantity $$G = Cmax/(\Sigma_0^{N-1} |Txi|^2)$$

is the average gain for all tones in the chunk, where Cmax is the maximized quantity C. Since there are a large number of tones in the chunk, the value of $\delta$ is over determined and very insensitive to noise. The predistorted tones for the next iteration for this chunk are given by $Tx_i - Y'_i/G$ for i=0 to N−1.

The above procedure determines a gain and distorted tones for one chunk in the in band region of the output spectrum from the signal generator. It is repeated for each chunk in the in band region of the spectrum.

Determining the distorted tones for the out-of-band regions presents additional challenges, and hence, a different computational scheme is used for the out-of-band regions than the one used for the in band regions. First, there is no $Tx_i$ for the out-of-band tone frequencies, at least for the first iteration. In addition, not all of the out-of-band frequencies will necessarily have non-zero amplitudes even in the successive iterations. Hence, there are no $Tx_i$ to which the algorithm can align to determine the normalization constant for the out-of-band tones. Accordingly, some other method for obtaining the phases of the $Y_i$ that are not zero and the gain are needed.

The present invention overcomes the lack of phase information for a non-zero tone in the out-of-band region by performing a number of "experiments". In each experiment, a probe tone is added to the input of signal generator 41 at a frequency corresponding to the out-of-band tone. The probe tone amplitude is the same for each of the probe tones; however, the phase of each probe tone differs from that of the other probe tones.

Consider a tone $Y_i$ in the current out-of-band chunk. The amplitude, $Y_i$, is known from the VNA spectrum; however, the phase is not known, and hence, the phase of the predistortion tone intended to eliminate this $Y_i$ is not known. Suppose a probe tone, $B_{i,n}$ is added to the input of signal generator 41, where n denotes the experiment number and denotes a different added phase angle. The output of the VNA will be the vector sum of $Y_i$ and $G_i B_{i,n}$, where $G_i$ is the magnitude of the gain of signal generator 41 for the $i^{th}$ tone of the current out-of-band chunk. The amplitude of the vector sum is provided by the VNA. This experiment is repeated for a number of $B_{i,n}$, for n=0 to N−1. The phase of the $B_{i,n}$ depends on n, but the amplitude remains constant. It can be shown that N=3 with a phase difference of 120 degrees between the $B_{i,n}$ is sufficient to determine the phase of $Y_i$, and hence, the phase of the cancelation tone needed to cancel this out-of-band distortion. In addition, it should be noted that the amplitude of the VNA output for an input having the correct phase to cancel $Y_i$ provides an estimate of $G_i$ provided $G_i B_{i,n}$ is less than $Y_i$.

To reduce the effects of noise, the amplitude of $G_i B_{i,n}$ should be as close to $Y_i$ as possible. Hence, it is advantageous to provide a good estimate for $G_i$. As noted above, the $G_i$ can be set to the $G_i$ values measured with the test input after adjusting the $G_i$ for the differences in the average RMS gain observed in the in band region of the current iteration. It should be noted that the in band gain G has complex values, but the RMS in band gain is calculated from the magnitude G. The phase information is not necessary because the experiments determine the phases of the cancelation tones.

The effects of noise can be further reduced by using more "experiments" to determine predistortion tones for the out-of-band regions to provide an over-determined set of measurements for the phase of the $Y_i$. However this approach increases the length of time needed to arrive at the final predistortion signal. In one exemplary embodiment, the number of experiments are only increased when the distortion approaches the noise floor.

It should be noted that the experiments for each out-of-band chunk can be run in parallel. That is, $B_{i,n}$ discussed above can all be added to the input signal at the same time for all of the tones in the chunk.

In the above-described embodiments, the out-of-band regions are treated differently because the ideal spectrum in those regions are tones with 0 amplitudes. For some ideal signals, there may be additional regions which ideally have tones with 0 amplitudes. For example a signal that has a notch in the spectrum at frequencies within the in band region as defined above. If the number of tones in the notch is relatively small compared to the number of tones in the chunk in which it is being processed, the chunk can be processed as an in band chunk even though it contains a region intended to have tones of 0 amplitude. For example, an in band chunk having a notch with less than 10% of the tones in the notch can be processed as an in band chunk as described above. Alternatively, the region of the notch can be treated as an out-of-band region and processed accordingly.

The present invention also includes a computer readable medium that stores instructions that cause a data processing system to execute the method of the present invention. A computer readable medium is defined to be any medium that constitutes patentable subject matter under 35 U.S.C. 101 and excludes any medium that does not constitute patentable subject matter under 35 U.S.C. 101. Examples of patentable media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for operating a data processing system to modify a time domain input signal to a signal generator to correct for distortions introduced by the signal generator, the method comprising:
    receiving a target signal specifying a signal to be generated by the signal generator;
    initializing an input signal with the target signal;
    a) inputting the input signal to the signal generator to arrive at a signal generator output signal;
    b) measuring a frequency spectrum of the signal generator output signal with a test instrument;
    c) updating the input signal based on a comparison of the measured frequency spectrum and a frequency spectrum of the target signal; and
    d) repeating steps a)-c) until an exit condition is satisfied, wherein the frequency spectrum of the signal generator output signal is divided into one or more in band regions and one or more out-of-band regions, and wherein updating the input signal for frequencies in one of the out-of-band regions comprises a different computational scheme than updating the input signal for frequencies in one of the in band regions.

2. The method of claim 1, wherein the different computational scheme for updating the input signal for frequencies in the one of the out-of-band regions comprises measuring the frequency spectrum in the one of the out-of-band regions at an out-of-band tone in response to a plurality of probe signals, each probe signal comprising the input signal combined with a corresponding probe tone having a known amplitude and phase, the corresponding probe tone being mapped by the signal generator to the out-of-band tone, the phase of each of the plurality of probe signals being different.

3. The method of claim 2, wherein the plurality of probe signals comprises three probe signals having different phases from one another.

4. The method of claim 2, wherein the computational scheme for updating the input signal comprises measuring a gain of the signal generator for one of the out-of-band tones by inputting a test signal having a known amplitude and phase in a corresponding tone in the input signal.

5. The method of claim 1, wherein the computational scheme for updating the input signal for frequencies in the one of the in band regions comprises determining an aligned output signal from the input signal and tones in the signal generator output signal.

6. The method of claim 5, wherein updating the input signal for frequencies in the one of the in band regions comprises determining a difference between each tone of the aligned output signal and corresponding tones in the target signal.

7. The method of claim 1, wherein the test instrument is a VNA, the in band regions being analyzed separately from the out-of-band regions by the VNA.

8. The method of claim 7, wherein the VNA is characterized by a maximum bandwidth that can be analyzed for any given LO frequency, the in band regions and the out-of-band regions being broken into chunks requiring less than the maximum bandwidth, each chunk utilizing a different LO frequency.

9. A system comprising:
    a signal generator having an input adapted to receive an input signal and an output adapted to transmit a time domain output signal based on said input signal to a DUT, said input signal being a repetitive time domain signal;
    a receiver adapted to measure a frequency spectrum of said time domain output signal while said time domain output signal is connected to said DUT;
    a controller that is adapted to alter said input signal while said time domain output signal is connected to said DUT, wherein said controller:
    a) inputs said input signal to said signal generator to arrive at said time domain output signal;
    b) measures a frequency spectrum of said time domain output signal with a test instrument;
    c) updates said input signal based on a comparison of said measured frequency spectrum and a frequency spectrum of a target signal; and
    d) repeats steps a)-c) until an exit condition is satisfied.

10. The system of claim 9 wherein said frequency spectrum of said time domain output signal is divided into one or more in band regions and one or more out-of-band regions, and wherein updating said input signal for frequencies in one of said out-of-band regions comprises a different computational scheme than updating said input signal for frequencies in one of said in band regions.

11. The system of claim 10 wherein said different computational scheme for updating said input signal for frequencies in said one of said out-of-band regions comprises measuring said frequency spectrum in said one of said out-of-band regions at an out-of-band tone in response to a plurality of probe signals, each probe signal comprising said input signal combined with a corresponding probe tone having a known amplitude and phase, said corresponding probe tone being mapped by said signal generator to said out-of-band tone, said phase of each of said plurality of probe signals being different.

12. The system of claim 10 wherein said different computational scheme for updating said input signal for frequencies in said one of said in band regions comprises determining an aligned output signal from said input signal and tones in said time domain output signal said signal generator.

13. The system of claim 12 wherein updating said input signal for frequencies in said one of said in band regions comprises determining a difference between each tone of said aligned output signal and corresponding tones in said target signal.

14. The system of claim 10, wherein said test instrument is a VNA, said in band regions being analyzed separately from said out-of-band regions by said VNA.

15. A tangible, non-transitory computer readable medium that stores instructions, which when executed by a data processing system, causes the data processing system, to execute a method for operating that data processing system to modify a time domain input signal to a signal generator to correct for distortions introduced by the signal generator, the method comprising:
  receiving a target signal specifying a signal to be generated by the signal generator;
  initializing an input signal with the target signal;
  a) inputting the input signal to the signal generator to arrive at a signal generator output signal;
  b) measuring a frequency spectrum of the signal generator output signal with a test instrument;
  c) updating the input signal based on a comparison of the measured frequency spectrum and a frequency spectrum of the target signal; and
  d) repeating steps a)-c) until an exit condition is satisfied, wherein the frequency spectrum of the signal generator output signal is divided into one or more in band regions and one or more out-of-band regions, and wherein updating the input signal for frequencies in one of the out-of-band regions comprises a different computational scheme than updating the input signal for frequencies in one of the in band regions.

16. The tangible, non-transitory computer readable medium of claim 15, wherein the computational scheme for updating the input signal for frequencies in the one of the out-of-band regions comprises measuring the frequency spectrum in the one of the out-of-band regions at an out-of-band tone in response to a plurality of probe signals, each probe signal comprising the input signal combined with a corresponding probe tone having a known amplitude and phase, the corresponding probe tone being mapped by the signal generator to the out-of-band tone, the phase of each of the plurality of probe signals being different.

17. The tangible, non-transitory computer readable medium of claim 15, wherein the computational scheme for updating the input signal for frequencies in the one of the in band regions comprises determining an aligned output signal from the input signal and tones in the output of the signal generator output signal.

18. The tangible, non-transitory computer readable medium of claim 17 wherein updating the input signal for frequencies in the one of the in band regions comprises determining a difference between each tone of the aligned output signal and corresponding tones in the target signal.

* * * * *